(12) United States Patent
Tauchi et al.

(10) Patent No.: US 6,734,694 B2
(45) Date of Patent: May 11, 2004

(54) METHOD AND APPARATUS FOR AUTOMATICALLY TESTING SEMICONDUCTOR DEVICE

(75) Inventors: Tsukasa Tauchi, Chofu (JP); Yuzi Yamamoto, Chofu (JP); Masami Miyasako, Hiroshima (JP); Kiyoshi Kinoshita, Hiroshima (JP); Mitsuhiro Yoshihira, Chofu (JP); Masao Nakamura, Chofu (JP)

(73) Assignee: Juki Corporation, Tokyo (JP)

( * ) Notice: Subject to any disclaimer, the term of this patent is extended or adjusted under 35 U.S.C. 154(b) by 59 days.

(21) Appl. No.: 10/092,163

(22) Filed: Mar. 5, 2002

(65) Prior Publication Data

US 2002/0130654 A1 Sep. 19, 2002

(30) Foreign Application Priority Data

Mar. 19, 2001 (JP) ........................ 2001-078362
Mar. 19, 2001 (JP) ........................ 2001-078363

(51) Int. Cl.$^7$ .............................................. G01R 31/28
(52) U.S. Cl. ...................................................... 324/765
(58) Field of Search ........................... 324/765, 158.1, 324/754, 758; 414/749.4, 416

(56) References Cited

U.S. PATENT DOCUMENTS

| 6,074,158 | A | * | 6/2000 | Yutaka et al. | .......... 414/416.07 |
|---|---|---|---|---|---|
| 6,137,303 | A | * | 10/2000 | Deckert et al. | .............. 324/765 |
| 6,313,652 | B1 | * | 11/2001 | Maeng | ........................ 324/760 |
| 6,323,669 | B1 | * | 11/2001 | Kang | ........................ 324/765 |
| 6,507,185 | B1 | * | 1/2003 | Hennekes et al. | ....... 324/158.1 |
| 6,518,745 | B2 | * | 2/2003 | Kim et al. | ................ 324/158.1 |

FOREIGN PATENT DOCUMENTS

| JP | 2000-12632 | 1/2000 |
|---|---|---|
| JP | 2001-41915 | 2/2001 |

* cited by examiner

Primary Examiner—Evan Pert
Assistant Examiner—Jimmy Nguyen
(74) Attorney, Agent, or Firm—Merchant & Gould, P.C.

(57) ABSTRACT

The apparatus 10 includes a tray 22 for holding a semiconductor device 18, an inspection connector 30 for automatically coupling to a connector 16 of the device 18, a probe 32 for supplying or receiving signals to or from terminals 14A of a device body 14 being in contact with each other, an inspection robot 36 for picking up the body 14 held in the tray and transporting it to the probe to get contact with or close to; a controller 66 to control the robot 36, and a tester 34 to test the device 18 by supplying input signals to one of the connector 30 or the probe 32 and receiving output signals from the other.

13 Claims, 14 Drawing Sheets

METHOD AND APPARATUS FOR AUTOMATICALLY TESTING SEMICONDUCTOR DEVICE

BACKGROUND OF THE INVENTION

1. Field of the Invention

The invention relates to a method and apparatus for automatically testing various properties of a semiconductor device that has a cable.

2. Description of the Related Art

There has been known, as shown in FIG. 13, such a semiconductor device 100 that has a cable connected with it.

The device 100 consists of a device body 104 connected with one end of a cable 102, and a connector 106 connected with the other end of the cable.

The device body 104, receiving a signal through the connector 106 and the cable 102, converts or amplifies the signal and outputs a signal from its terminals 104A.

The device body 104 sometimes receives signals through the terminals 104A and outputs the processed signals from the connector 106. The cable 102 is generally an optical fiber or a conductive wire, and the body 104 has a semiconductor circuit (not shown) for processing the signals.

For inspecting the various properties of the packaged device with a cable, such a method will be applied to as in a general semiconductor device (without a cable) that the terminals 104A of the body 104 are brought into contact with an inspection probe.

FIG. 13 illustrates a testing configuration in which a board-type probe 108 is in contact with the terminals 104A from under the device 100.

FIG. 14 illustrates a testing configuration in which a pin-type probe 110 is in contact with the terminals 104A from over the device 100.

In both cases, input signals are applied from a port 112A of a tester 112 to the device body 104 through the connector 106 and the cable 102, and output signals are sent to a port 112B of the tester 112 through the probe 108 or 110 contacting with the terminals 104A, whereby the tester 112 inspects the properties of the device 100, comparing the input signals with the output ones.

It is also possible to test the device in reversal direction by changing the port 112A with the port 112B.

In order to achieve precise inspection, it is necessary for the device terminals to be in contact with the probe precisely. However, because of fine pitch of the terminals, manual setting between the terminals and the probe sometimes produces erroneous contact, causing incorrect test result.

Therefore, there exists a need to test the semiconductor device automatically.

In order to automate the testing of semiconductor devices, it is required to transport the devices automatically.

Since the semiconductor device has a flexible cable, irregular deformation of the cable easily occurs during transportation, which gives excess stress to the connection point between the device body and the cable. This affects the test result of the device, or sometimes damages the device. Therefore, it has been difficult to automate the transportation and inspection of the semiconductor device connected with a cable.

SUMMARY OF THE INVENTION

It is therefore an object of the invention to provide a method and apparatus for automatically testing a semiconductor device with a cable in high precision.

In order to achieve the object mentioned above, the invention provides for an automatic semiconductor device testing apparatus. The device has a cable, a device body connected with one end of the cable, and a connector connected with the other end of the cable. In an apparatus aspect of the invention, the invention includes a tray for holding the device so that the connector can couple to a mating connector directly or indirectly with the device held in the tray; a tray storage capable of storing a plurality of piled trays, having a tray selecting mechanism for supporting a selected tray separated from the adjacent trays, and an ejector for ejecting the tray supported on the selecting mechanism; a transport mechanism for transporting the tray ejected from the tray storage sequentially to an inspection area with the device held in the tray; an inspection connector for automatically coupling to the connector held in the tray at the inspection area; a probe disposed at the inspection area for applying or receiving signals to or from device terminals of the device body, being in contact with or close to each other; an inspection robot for picking up the device body held in the tray and transporting it to the probe to get contact with or close to; a controller to control the inspection robot; and a tester for testing the semiconductor device by applying input signals to one side of the inspection connector or the probe and receiving output signals from the other side.

In this aspect, the tray holds the cable near the device body so that the cable can be set along a connecting direction of the device body, and guided in the connecting direction when the device body is removed from or restored into the tray.

Preferably, the apparatus may further include a pressing mechanism for pressing the terminals on the probe in a state that the device body is in contact with or close to the probe.

In a particular arrangement, the apparatus further includes a device body imaging device for imaging the posture of the device body retained on the inspection robot. The controller has a reference posture storing section for storing a reference retained posture, and a posture error calculating section for calculating an error between the reference posture and the retained posture imaged by the device body imaging device, and controls the inspection robot to transport the device body onto the probe together with correction of the calculated error.

In another aspect of the invention, the apparatus has a tray transfer device for holding and transferring the tray. The controller controls both of the tray transfer device and the inspection robot in synchronism with each other, so that the device body can be transported from the imaged position by the imaging device to the probe with the relative position between the device body and the cable maintained.

Preferably, the tray transfer device may be a rotation table to hold and rotatably transfer the tray, and the device body imaging device and the probe are arranged along an arced locus concentric with the table. The controller controls the inspection robot so that the device body can rotatably move along the arced locus from the imaging device to the probe.

Further, the rotation table can hold a plurality of trays.

In yet another aspect of the invention, the apparatus may include a probe imaging device for detecting a probe set position. The controller has a reference position storing section for storing a reference set position of the probe, and a position error calculating section for calculating an error between the reference set position and the probe set position detected by the probe imaging device, and controls the inspection robot so as to transport the device body onto the probe with the set position error corrected.

Particularly, the probe imaging device can detect the position of the device terminals brought into contact with or close to the probe. The controller has a displacement calculating section for calculating the displacement between the probe and the terminals based on the probe set position and the position of the terminals, and an allowable value storing section for storing a given allowable displacement value. The controller controls the inspection robot so that the device body can get into contact with or close to the probe with the displacement corrected if the calculated displacement is over the allowable value.

In still another aspect, the apparatus is provided with a front-end system and a front-end robot. The system executes a heat-retaining process for keeping the device body in a given temperature, a dust removing process for removing foreign substance from the device body, and an electrostatic discharge process for discharging static electricity from the device body. The front-end robot picks up the device body held on the tray, and transfers it to the front-end system.

In a particular embodiment, the inspection robot can also serve as the front-end robot.

In further aspect of the invention, the transport mechanism is capable of transporting back a tray, which holds the inspected device, to the tray storage, and has an unloader for unloading the returned tray into an open space in the tray selecting mechanism.

In a method aspect of the invention, the apparatus includes the following steps: holding a semiconductor device in a tray, the device having a cable, a device body connected with one end of the cable, and a connector connected with the other end of the cable, so that the connector can couple to a mating connector directly or indirectly; storing a plurality of the trays in a tray storage; selecting a certain tray from the tray storage; transporting the selected tray sequentially to an inspection area with the device held in the tray; coupling automatically an inspection connector to the connector held in the tray at the inspection area; bringing the device body into contact with or close to a probe; testing the device automatically and continuously by applying input signals to one side of the inspection connector or the probe and receiving output signals from the other side; and returning the tray after the test into the tray storage on its expected step position.

According to the invention, a semiconductor device connected with a cable can be examined automatically.

DESCRIPTION OF THE PREFERRED EMBODIMENTS

Embodiments of the invention will now be described in detail with reference to the accompanying drawings.

Figure 1:
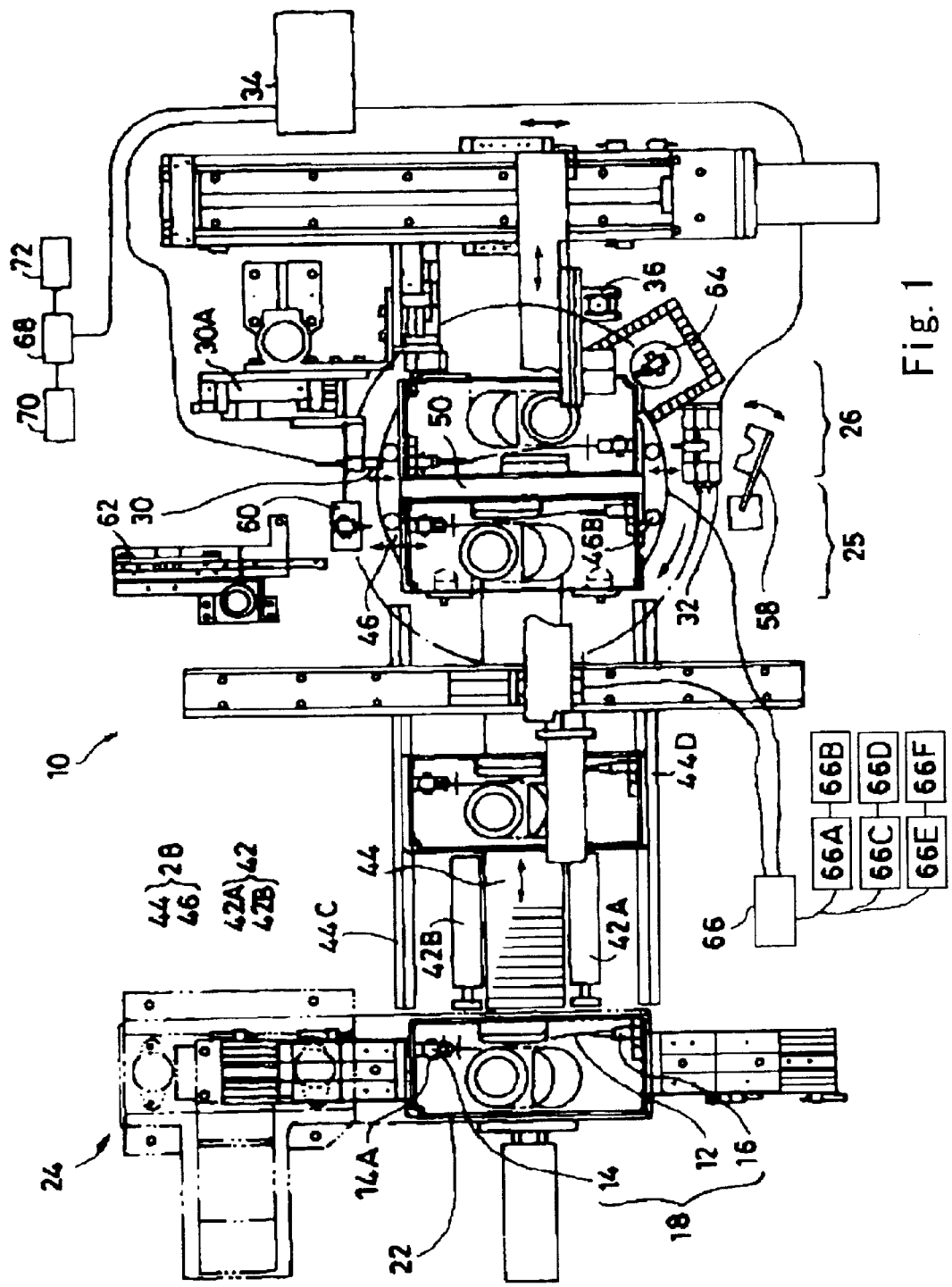
FIG. 1 is a schematic plan view including a part of block diagram showing an automatic semiconductor device testing apparatus according to one embodiment of the invention.
Figure 2:
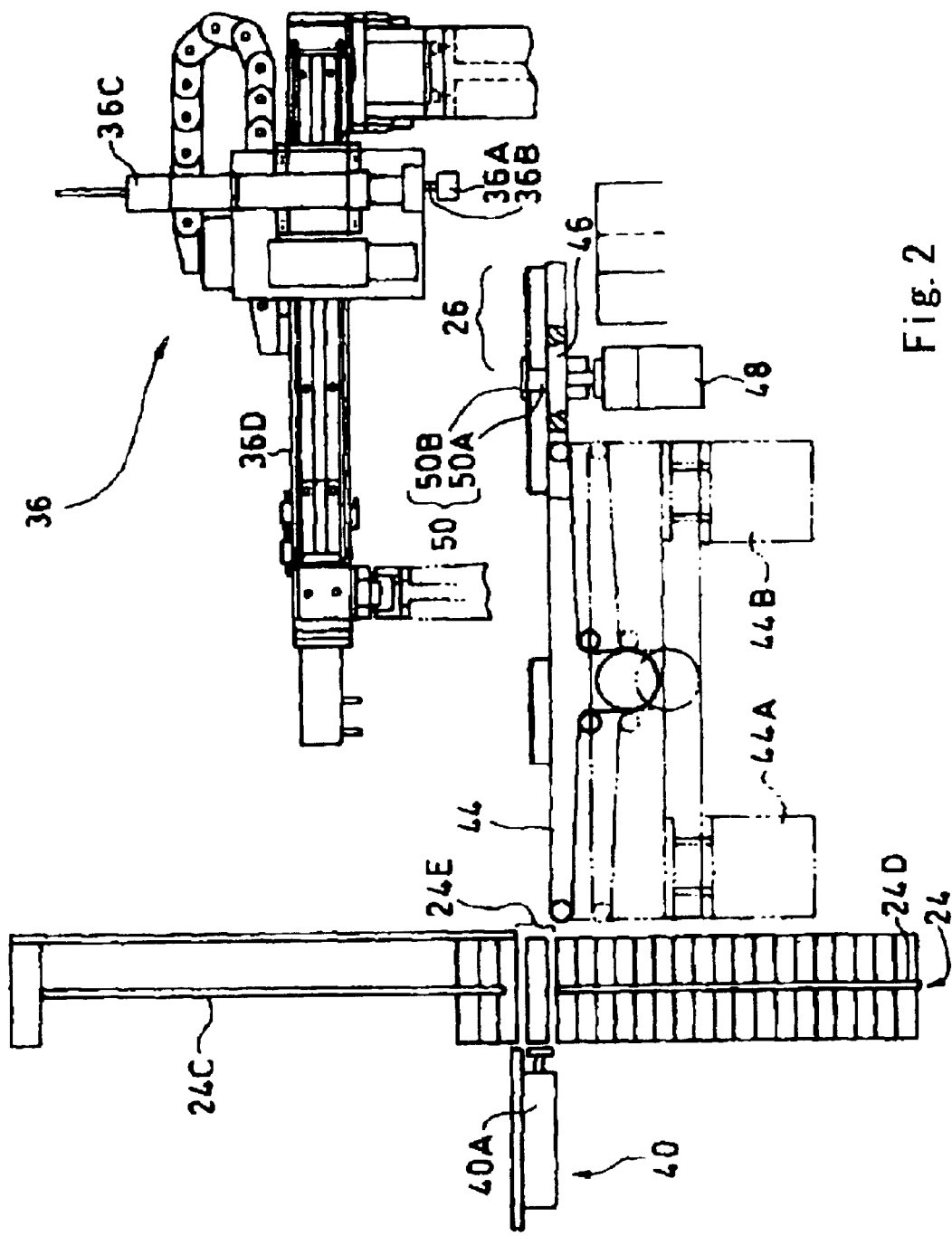
FIG. 2 is a front elevation of the apparatus.
Figure 3:
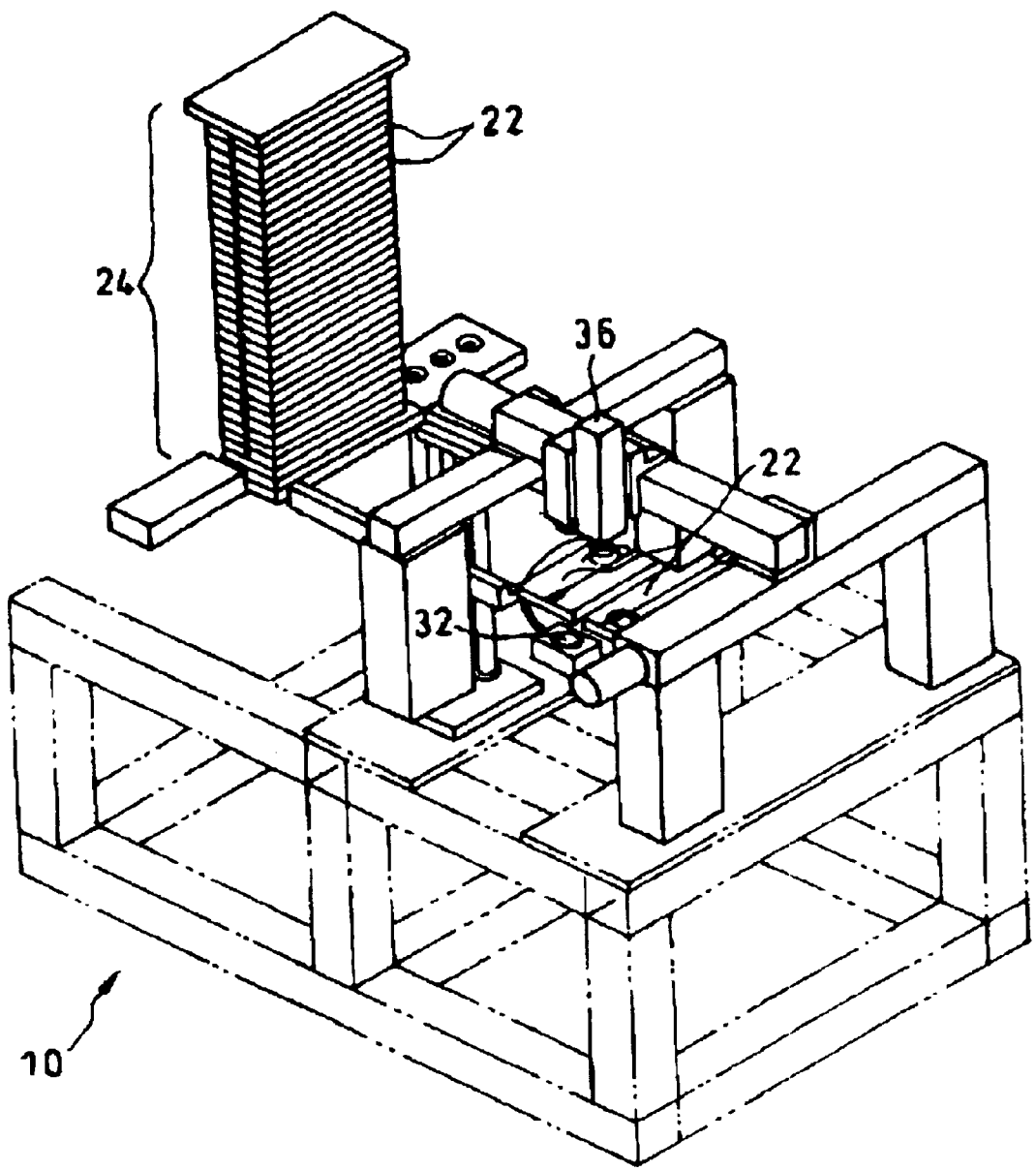
FIG. 3 is a perspective view of the apparatus.
Figure 4:
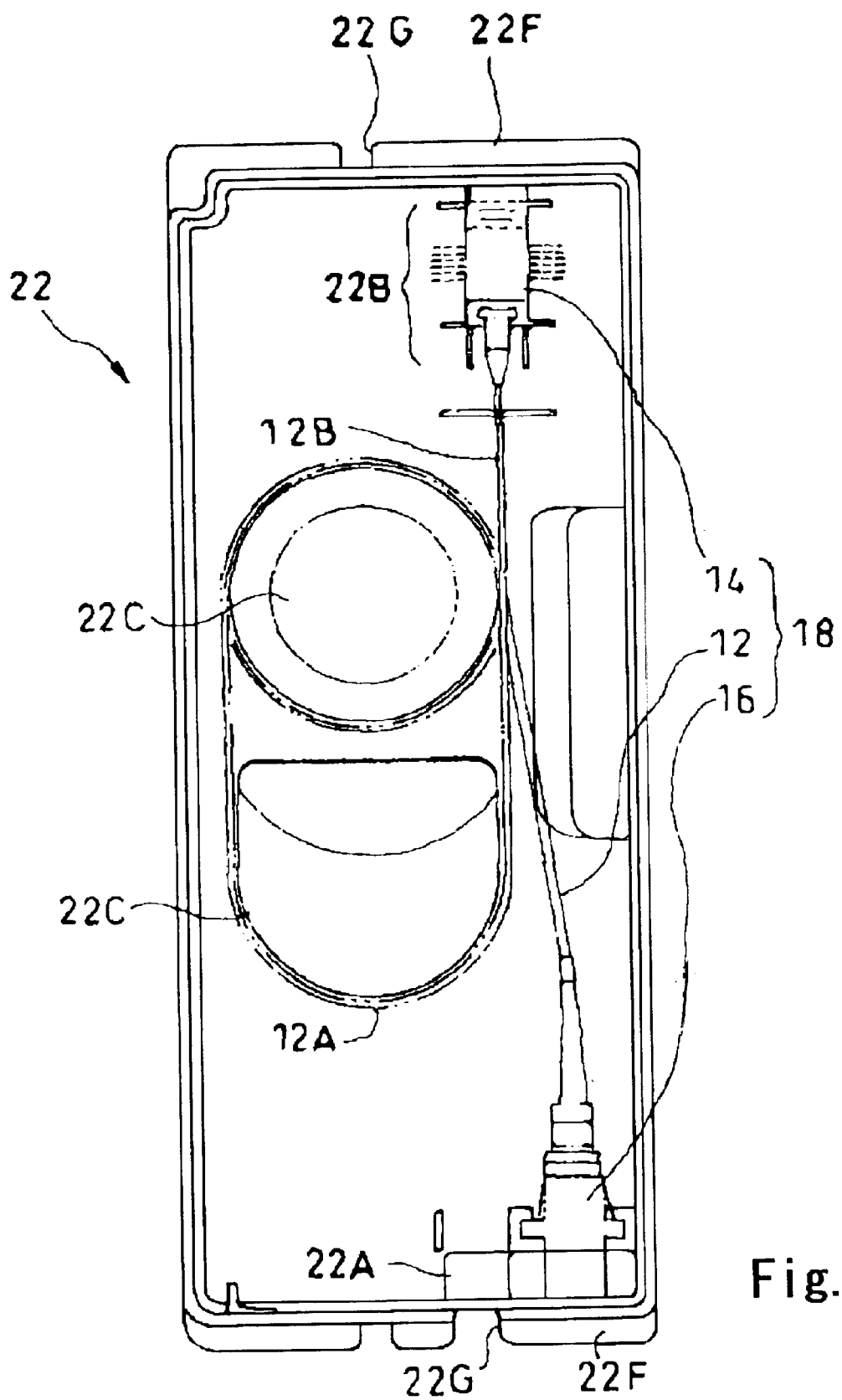
FIG. 4 is an enlarged plan view showing the structure of a tray for use with the apparatus.

A semiconductor device 18 to be tested, as shown in FIG. 4, has a cable 12, a device body 14 connected with one end of the cable 12, and a connector 16 connected with the other end of the cable 12. Referring to FIGS. 1 to 3, an automatic semiconductor device testing apparatus 10 includes a tray 22 for holding the device 18 so that the connector 16 can couple to a mating connector directly or indirectly with the device 18 held in the tray 22; a tray storage 24 for storing a plurality of the trays 22; a transport mechanism 28 for transporting the tray 22 sequentially from the tray storage 24 to an inspection area 26 with the device 18 held in the tray; an inspection connector 30 for automatically coupling to the connector 16 held in the tray 22 at the inspection area 26; a probe 32 disposed at the inspection area 26 for applying or receiving signals to or from the device body 14, being in contact with or close to device terminals 14A of the device body 14; an inspection robot 36 for picking up the device body 14 held in the tray 22 and transporting it to the probe 32 to get contact with or close to; a controller 66 to control the inspection robot 36; and a tester 34 for testing the device 18 by supplying input signals to the inspection connector 30 and obtaining output signals from the probe 32.

The tray 22 holds the cable 12 near the device body 14 so that the cable 12 is set along a connecting direction of the device body 14 guided in the connecting direction when the device body 14 is removed from or restored into the tray 22.

Figure 5:
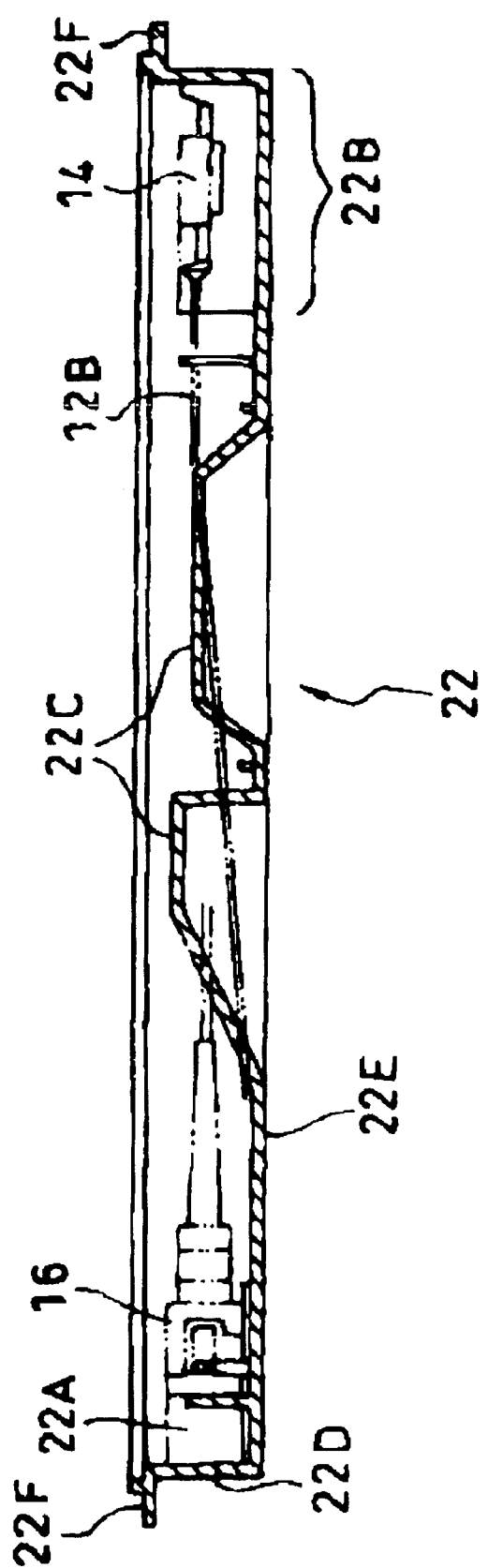
FIG. 5 is a side view of the tray.

Referring to FIGS. 4 and 5, the tray 22 has a relay connector (connector holder) 22A mounted near at one end of a longitudinal side for coupling to the connector 16, and a body holder 22B near at the other end for removably holding the device body 14. Provided at the center portion of the tray 22 is a cable holder 22C protruding upward so as for an intermediate portion 12A of the cable 12 to be wound around, supporting along the connecting direction an entrance portion 12B extending to the device body 14 side from the intermediate portion 12A, and having at the connector 22A side a slanted surface rising toward the holder 22B.

The tray 22 has a sidewall 22D, and a bottom 22E for closing one end of the sidewall 22D, the sidewall 22D enclosing the connector holder 22A, the body holder 22B, and the cable holder 22C. Piling a plurality of trays 22 can isolate the inside of the sidewall 22D from outside.

Further, the tray 22 is provided with rectangular flanges 22F at both lengthwise ends, each horizontally protruding from the near upper end. The flange 22F has a cut 22G on it.

The tray 22 is made of conductive plastic.

Figure 6:
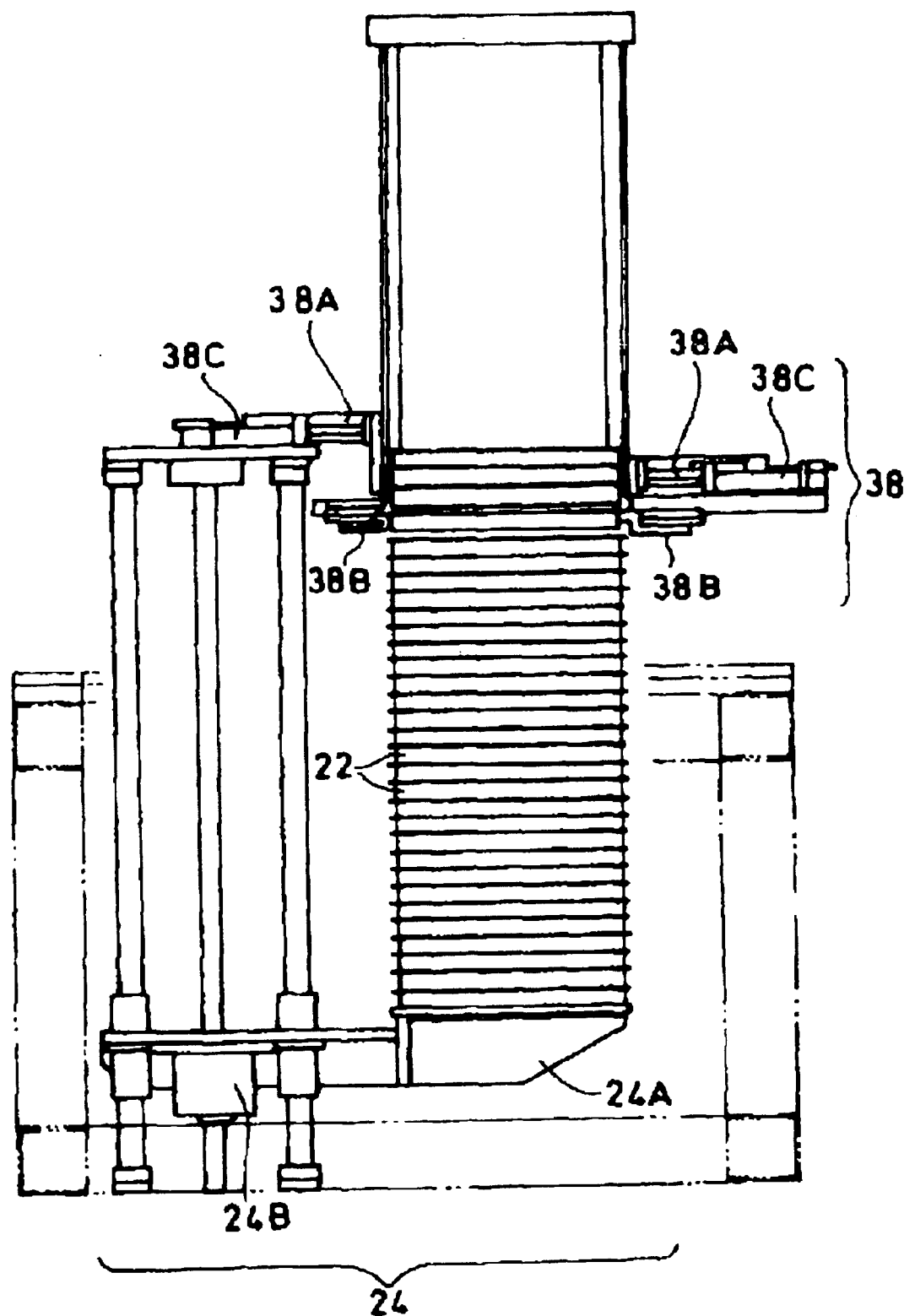
FIG. 6 is a side elevation showing a tray storage of the apparatus.

As shown in FIGS. 2 and 6, the tray storage 24, storing piles of trays 22, includes a tray selecting mechanism 38 for supporting a selected tray separated from the adjacent trays, and an ejector 40 for ejecting the tray 22 supported on the selecting mechanism 38 onto the transport mechanism 28.

The tray storage 24 includes a support base 24A for supporting the plural trays 22 from underside, an actuator 24B for moving up and down the base 24A supported from underside, and an upper guide 24C and lower guide 24D for guiding the trays 22 in an up-and-down direction.

Each of the guides 24C and 24D are a pair of rods extending in the up-and-down direction, engaging with the cuts 24G of the tray 22 so as to pinch the tray 22 from both sides in the lengthwise direction.

There is a space between the lower end of the upper guide 24C and the upper end of the lower guide 24D. This space is larger than the height of one tray 22, constituting a gap 24E on the storage 24.

That is, the trays 22 are moved up and down, guided by the guides 24C and 24D, and only one tray 22 in the gap 24E can be released from the guides 24C and 24D.

The tray selecting mechanism 38 has an upper support 38A, and a lower support 38B.

Figure 7:
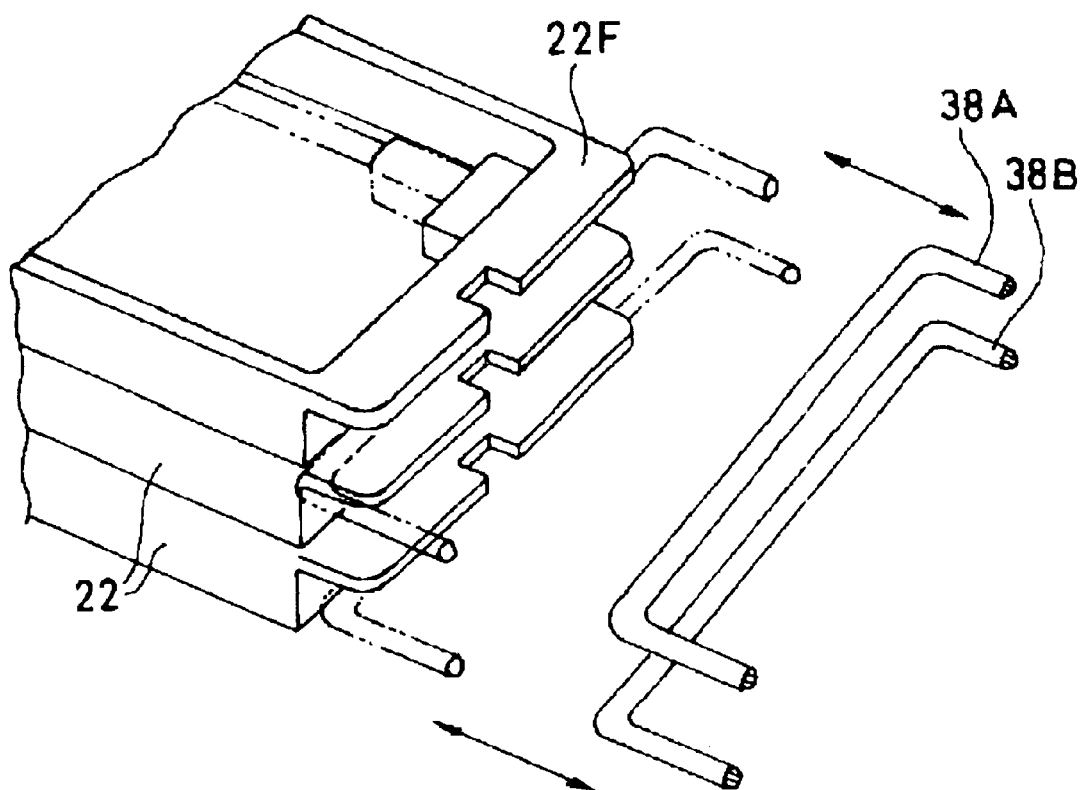
FIG. 7 is a perspective view illustrating a tray selecting mechanism of the apparatus.

As shown in FIG. 7, the upper support 38A is a pair of U-shaped bars, disposed horizontally at near upper part of the gap 24E so as to pinch the tray 22 from both ends in the lengthwise direction, and moved to and from the tray side by actuators 38C.

The upper support 38A gets contact with the flange 22F from the lower to support the tray 22 when projected put, and moves apart from the tray 22 when retracted.

The pair of lower supports 38B, which are in the same shape as of the upper support 38A, are disposed lower than and apart from the upper support 38A by slightly larger space than the height of one tray 22. The support 38B can also be projected or retracted by the actuator 38D as in the support 38A so as to support the tray 22 when projected.

An upper-side tray, which is adjacent to the tray supported by the lower supports 38B, is supported by the upper support 38A, and further downward movement of other lower-side trays allows the tray supported by the lower supports 38B to be selectively separated from the other trays.

The ejector 40 is disposed in the vicinity of the gap 24E and opposite side to the transport mechanism 28, and has an actuator 40A for horizontally pushing out the tray 22 supported by the lower support 38B toward the transport mechanism 28.

The transport mechanism 28 is capable of transporting back a tray 22, which holds the inspected device 18, to the tray storage 24, and has an unloader 42 for unloading the returned tray 22 into an open space in the tray selecting mechanism 38.

Referring to FIGS. 1 and 2, the unloader 42 has a pair of actuators 42A and 42B disposed in the vicinity of the gap 24E at the transport mechanism 28 side.

The actuators 42A and 42B are disposed at both sides of the mechanism 28, and push the tray 22 on the mechanism 28 into the selecting mechanism 38 for unloading.

The transport mechanism 28 includes a belt conveyor 44 disposed horizontally between the storage 24 and the inspection area 26, and a rotation table 46 disposed at the inspection area 26 side of the conveyor 44.

The conveyor 44 can transport the tray 22 in both directions, and be movable up and down by actuators 44A and 44B disposed at both ends of and under the conveyor 44. The upper surface of the conveyor 44 at the raised position is flush with the upper surface of the table 46. Additionally, provided is a pair of guide rails 44C and 44D for supporting and guiding the flanges 22F of the tray at the raised position along a transport direction.

The rotation table 46 is a near H-shaped round plate having a pair of U-shaped cuts 46A in symmetry on the circumference of the table. The table 46 is arranged horizontally and rotatably supported by an actuator 48 disposed under it.

The conveyor 44 and the table 46 are so arranged that the end portion of the conveyor 44 at its raised position can enter into one of the cuts 46A.

The table 46 is provided with a bar-type stopper 50 at its upper surface in a diameter direction in the middle of the pair of cuts 46A. The stopper 50 is T-shaped in section, and fixed to the upper surface of the table 46 at the lower end of its rib 50A. The space between a T-shaped flange 50B and the table 46 surface is slightly larger than the height of the tray 22.

Figure 8:
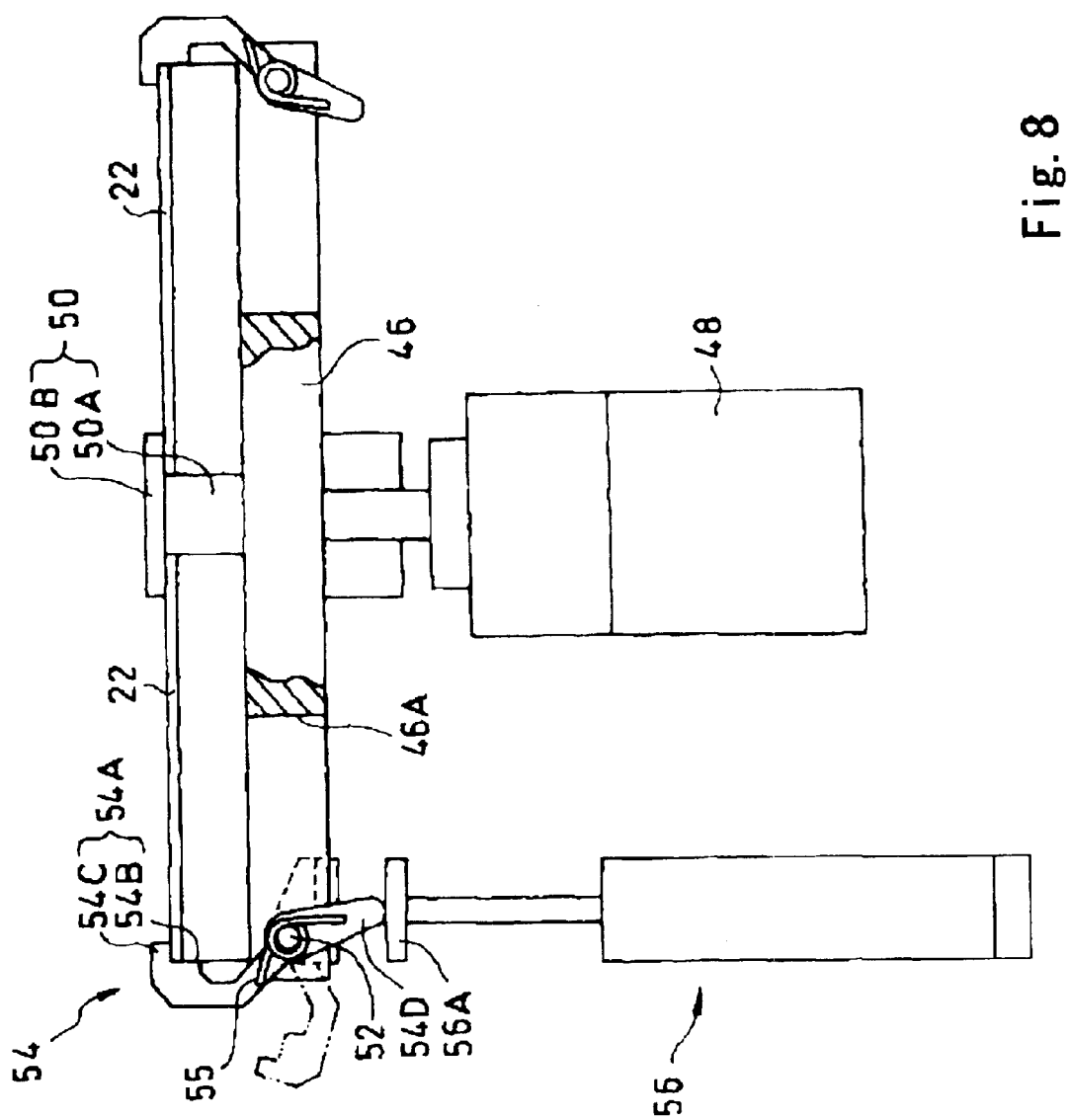
FIG. 8 is a side view showing the structure of a rotation table of the apparatus.

As shown in FIG. 8, in the vicinity of the opening of each cut 46A, a pair of clamps 54 are pivotally mounted around respective pins 52 that are parallel with the stopper 50. Each clamp 54 swings between a closed position, where a top end 54A comes closer to the stopper 50, and an open position, where is slightly lower than the upper surface of the table 46, and where is reached with gradual lowering apart from the stopper 50. The clamp 54 is urged toward the closed position by a coil spring 55.

The top end 54A is consist of a side wall 54B and a protrusion 54C, the wall 54B opposing to the stopper 50 at the closed position, and the protrusion 54C protruding toward the stopper 50 side from the upper end of the wall 54B.

The distance between the wall 54B at the closed position and the stopper rib 50A is equal to the width (short side) of the tray 22. The distance between the protrusion 54C at the closed position and the table 46 surface is slightly larger than the height of the tray 22.

The proximal end 54D of the clamp 54 at the closed position protrudes lower than the lower surface of the table 46, and is slightly inclined toward the center of the table 46 relative to a vertical lower.

Under the proximal end 54D, an actuator 56 is provided so that an upper end 56A can move up and down. As the upper end 56A moves up, the end 56A gets contact with and slides on the proximal end 54D, which causes the top end 54A to move apart from the stopper 50 against the urging force of the spring 55. When the upper end 56A goes down, the top end 54A comes closer to the stopper 50.

That is, driving of the actuator 56 allows the tray 22 to be held between the clamps 54 and the stopper 50 or released.

Mounted over the table 46 surface are two pairs of, namely, four guide pins 46B neighboring both ends of the stopper 50 for restricting the movement of the tray 22 in the lengthwise direction (see FIG. 1).

A belt conveyor 44 side of the table 46 is defined as a front-end area 25, and an opposite side to the conveyor 44 of the table 46 the inspection area 26. Each of two areas can hold a tray 22, and the rotation of the table 46 permits the tray 22 held on one of two areas to be transported to the other area.

In a place near the table 46 and at the side of front-end area 25, provided are a front-end system 60, and a front-end robot 62. The system 60 executes a heat-retaining process for keeping the device body 14 in a given temperature, a dust removing process for removing foreign substance from the device body 14, and an electrostatic discharge process for discharging static electricity from the device body 14. The robot 62 picks up a device body 14 from the tray 22 held on the front-end area 25, and transfers it to the front-end system 60.

The front-end system 60 is so arranged as to align with the connecting direction between the device body 14 and the cable 12 that are held in the tray 22 placed on the front-end area 25.

The front-end robot 62 includes a vacuum nozzle for picking up the device body 14, and a driving mechanism for moving the nozzle in an up-and-down direction and horizontal directions.

The probe 32 is disposed at a symmetrical position about the center shaft of the table 46 with respect to the front-end system 60.

Specifically, the probe 32 is so disposed as to align with the connecting direction between the device body 14 and the cable 12 that are held in the tray 22 placed on the inspection area 26.

Provided near the probe 32 is a pressing mechanism 58 for pressing the terminals 14A against the probe 32 with the body 14 being in contact with the probe 32.

Figure 9:
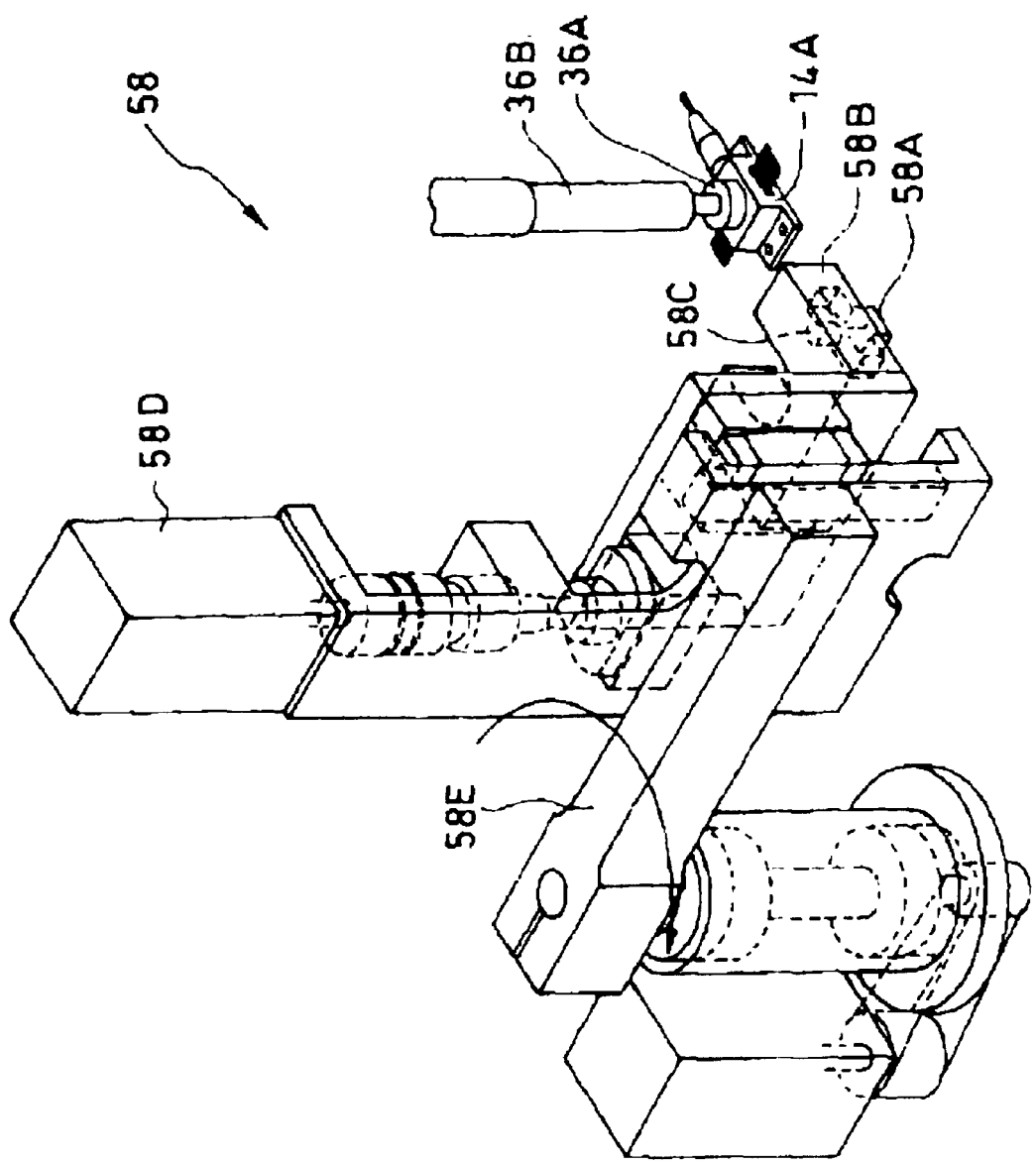
FIG. 9 is a perspective view showing a pressing mechanism of the apparatus.

As shown in FIG. 9, the pressing mechanism 58 includes a pad 58A for getting contact with the terminals 14A, a base portion 58B for slidably supporting the pad 58A in the up-and-down direction within a certain distance, a compression spring 58C mounted on the base 58B for urging the pad 58A downward, a head 58D for supporting the base 58B and for driving the base in the up-and-down direction, and an arm 58E for supporting the head 58D at the top end so as to bring close to or apart from the probe 32 with its horizontal rotation. The base 58B is formed in U-shape to avoid interference with the nozzle 36A on the inspection robot 36.

Provided near the probe 32 is a device body imaging device 64 with a CCD camera for detecting the posture of the device body 14 retained on the inspection robot 36.

The imaging device 64 is connected with the controller 66. The controller 66 has a reference posture storing section 66A for storing a reference retained posture, and a posture error calculating section 66B for calculating an error between the reference posture and the retained posture detected by the imaging device 64, and transports the device body 14 onto the probe 32 with the error corrected.

The front-end system 60, the imaging device 64, and the probe 32 are arranged along an arced locus concentric with the table 46.

The imaging device 64 is disposed so as to agree with the connecting direction between the body 14 and the cable 12 held in the tray 22 that is in a position rotated clockwise 135° from the front-end area 25.

The controller 66 controls both of the actuator 48 and the inspection robot 36 so as to synchronize with each other, so that the device body 14 can be transported along the arced locus from the imaging position by the imaging device 64 to the probe 32 with the relative position between the body 14 and the cable 12 maintained.

The inspection robot 36, as shown in FIG. 2, includes a vacuum nozzle 36A to absorb the device body 14, a cylindrical slide shaft 36B extending in the up-and down direction for attaching the nozzle 36A at the lower end, a head 36C for driving the slide shaft 36B up and down and around its axis, and an X-Y driving mechanism 36D for driving the head 36C in horizontal directions.

The robot 36 includes a probe imaging device 65 having a CCD camera for detecting the set position of the probe 32. The controller 66 has a reference position storing section 66C for storing a reference set position of the probe 32, and a position error calculating section 66D for calculating an error between the reference set position and the probe set position detected by the imaging device 65, and controls the inspection robot 36 so as to transport the device body 14 onto the probe 32 with the set position error corrected.

Additionally, the probe imaging device 65 can detect the position of the device terminals 14A brought into contact with the probe 32. The controller 66 has a displacement calculating section 66E for calculating the displacement between the probe 32 and the terminals 14A based on the probe set position by the imaging device 65 and the position of the terminals 14A, and an allowable value storing section 66F for storing a given allowable displacement value. The controller 66 controls the inspection robot 36 so that the device body 14 can get into contact with the probe 32 with the displacement corrected if the calculated displacement is over the allowable value.

The controller 66 can also detect abnormal conditions like bent terminals 14A, and alert the operator if the bent amount is over an allowable value.

The inspection connector 30 is disposed at the opposite side to the probe 32 with the tray 22 on the inspection area 26 positioned between them.

The connector 30 is driven by an actuator 30A to come close to or apart from the tray 22 on the inspection area 26, and automatically connectable with the relay connector 22A.

The tester 34 is connected with the inspection connector 30 and the probe 32.

These electric components, such as actuators, are connected with a central processor (CPU) 68. The CPU 68 is also interfaced with an input device 70 and a display 72.

A description will now be given of the action of the automatic semiconductor device testing apparatus 10.

The apparatus 10 executes the test of the semiconductor device 18 according to the following steps: holding the device 18 in the tray 22; storing a plurality of trays 22 in the tray storage 24; selecting a certain tray 22 from the tray storage 24; transporting the selected tray sequentially to the inspection area 26 with the device 18 held in the tray; coupling automatically the inspection connector 30 to the connector 16 held in the tray 22 at the inspection area 26; bringing the device body 14 into contact with or close to the probe 32; testing the device 18 automatically and continuously by applying input signals to the inspection connector 30 and obtaining output signals from the probe 32; and returning the tray 22 after the test into the tray storage 24 on its expected step position.

First, an operator, for setting the device 18 on the tray 22, connects the connector 16 with the relay connector 22A, winds the cable 12 around the cable holder 22C, and fits the device body 14 into the body holder 22B. This operation is easy without necessity of preciseness.

The operator sets a plurality of devices 18 on each tray 22 in a similar manner, and piles up these trays 22 on the tray storage 24.

This piling shuts off the inside of the tray 22 from outside, leading to prevention of the inside device 18 from getting dust or the like.

Next, the operator manually engages each cut 22G of the piles of trays 22 with the upper guide 24C of the storage 24, which prevents the piles of trays 22 from collapsing.

After the above preparation, the operator selects a tray to be inspected out of the piled trays by operating the input device 70, where either 100% test or sampling test may be applied out of the piles of trays. Then, the apparatus 10 executes automatic inspection under the control of the CPU 68.

Meanwhile, the belt conveyor 44 is previously set to the raised position so as to place the conveyor 44 into the cut 46A of the table 46, and the actuator 56 is in the raised state to open the clamp top end 54A.

The CPU 68 causes the upper support 38A to project out toward the tray 22 after driving the actuator 24B to move up and down the support base 24A so that the first tray 22 to be inspected (hereinafter referred to as "inspection tray") and an upper side tray 22 adjacent to the inspection tray 22 are, at their flanges 22F, positioned under and over the upper support 38A, respectively.

Figure 10:
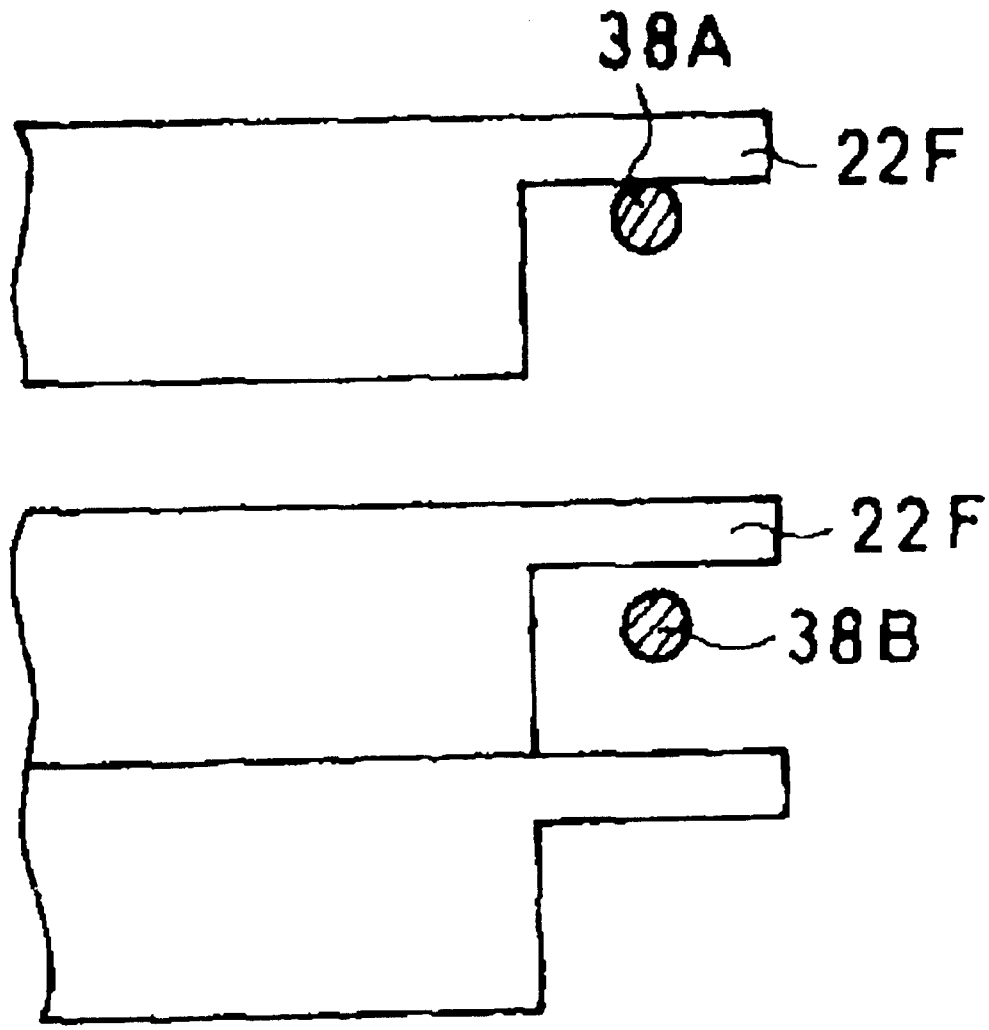
FIG. 10 is a side view illustrating an action of the selecting mechanism.
Figure 11:
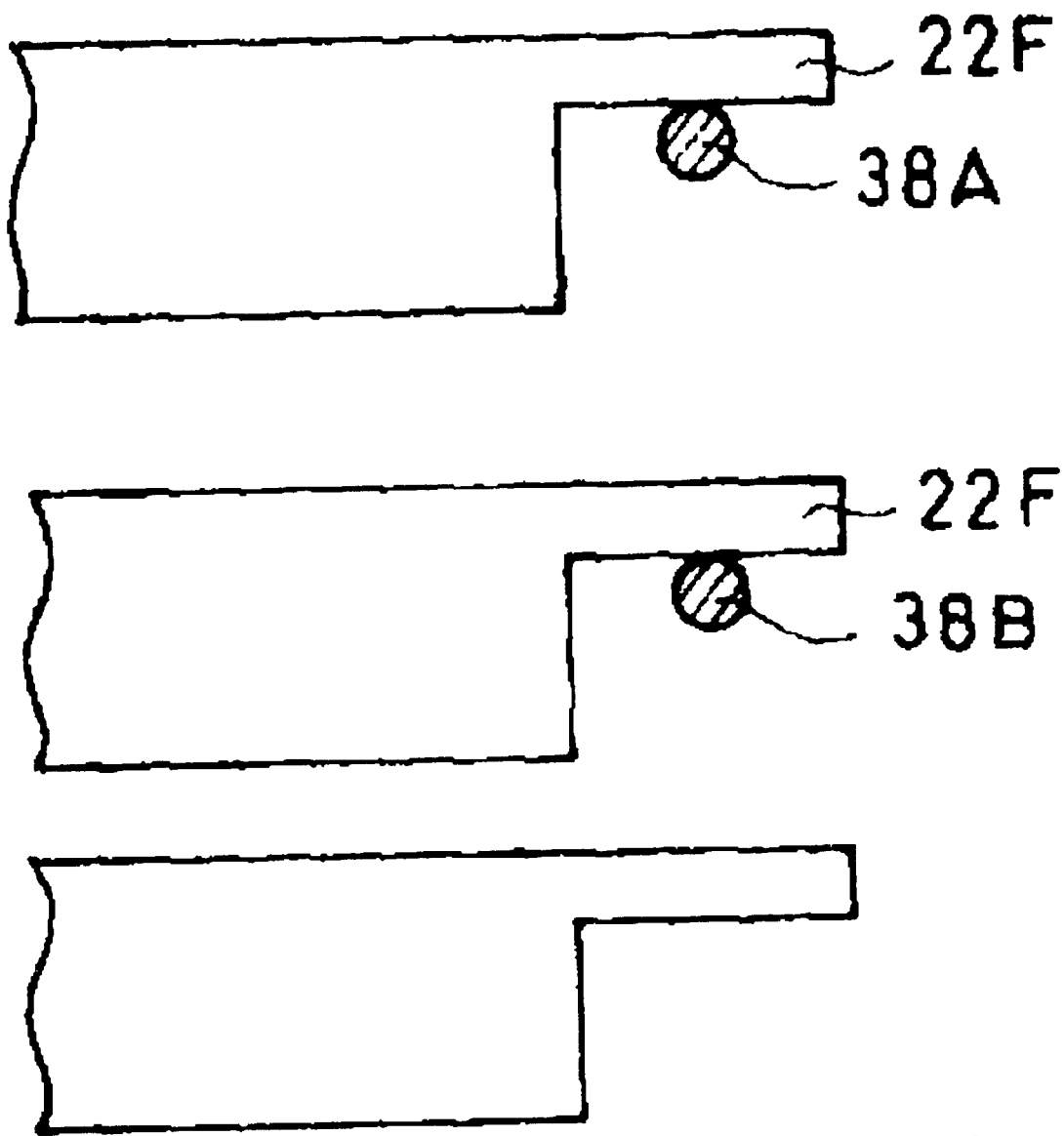
FIG. 11 is a side view illustrating an action of the selecting mechanism.

With this state, when the base 24A is slightly lowered, the upper side tray 22 at the flange 22F, as shown in FIG. 10, gets into contact with the upper support 38A to be supported thereon.

Downward movement of the base 24A allows the inspection tray 22 to be separated apart from the upper side tray 22.

Then, the lower support 38B is projected out toward the tray 22 with the base 24A lowered so that the inspection tray 22 and a lower side tray 22 adjacent to the inspection tray are, at their flanges 22F, positioned over and under the lower support 38B, respectively.

When the base 24A is further lowered in the above state, the inspection tray 22 stays at the gap 24E, being held on the lower support 38B at the flange 22F and separated from the lower side tray 22. This downward movement of the base 24A allows the inspection tray 22 to be separated from both trays adjacent thereto.

In this state, the actuator 40A of the ejector 40 is projected toward the inspection tray 22, which allows the tray 22 to be ejected from the storage 24 with its sliding on the upper support 38B, and to be placed on the conveyor 44.

The conveyor 44 transports the placed inspection tray 22 to the rotation table 46. At this time, the pair of guide rails 44C and 44D guide the tray 22 along the transport direction, regulating the movement in the lengthwise direction of the tray 22. The inspection tray 22 gets contact with the stopper 50 passing between the guide pins 46B on the table 46.

In this state, the actuator 56 is driven downward, which causes the clamp top end 54A to get contact with the inspection tray 22 by the urging force of the coil spring 55.

That is, the inspection tray 22 is held on the table 46 at the front-end area 25 by the clamp 54, the stopper 50, and the guide pins 46B.

Then, the actuators 44A and 44B are driven to lower the conveyor 44, which permits the table 46 to rotate, released from the conveyor 44 at the cut 46A.

Thereafter, the front-end robot 62 picks up the device body 14 from the inspection tray 22, and transports it to the front-end system 60 with the cable 12 pulled out. Since the system 60 is disposed so as to agree with the connecting direction between the body 14 and the cable 12 held in the tray 22, the transportation of the body 14 allows the cable 12 to be pulled out in the connecting direction, which hardly reforms the cable 12 at the near connecting portion.

That is, excessive stress is not generated at the connecting portion between the body 14 and the cable 12.

The system 60 removes dust or the like from the body 14 by blowing air, discharges static electricity, and keeps it in a constant temperature with heating or cooling.

After finishing these front-end processes, the robot 62 returns the device body 14 to the body holder 22B of the inspection tray 22. The cable 12 is set again on the cable holder 22C in the original curved shape, being guided by the slope of the holder 22C. The device body 14 does not get static electricity again because the tray 22 is made of conductive plastic.

Next, the actuator 48 rotates the table 46 clockwise by 135 degrees, which rotatably transports the tray 22 from the front-end area 25 to the inspection area 26.

This directs the connecting direction between the body 14 and the cable to agree with the device body imaging device 64.

Then, the inspection robot 36 picks up the device body 14 from the inspection tray 22, pulling out the cable 12, and transports it over the imaging device 64.

Because of the same reason for connecting direction as in the front-end process, the near connecting point can avoid being damaged. Additionally, the posture of the body 14 retained by the robot 36 is stable. The imaging device 64 takes the image and detects the posture of the body 14.

By comparing the actually retained posture with the reference posture previously stored, and calculating an error between the postures, the controller 66 controls the robot 36 so as to transport the device body 14 onto the probe 32 together with the correction of the calculated error.

The controller 66 can also detect abnormal conditions like bent terminals 14A, and alert the operator if the bent amount is over an allowable value.

Figure 12:
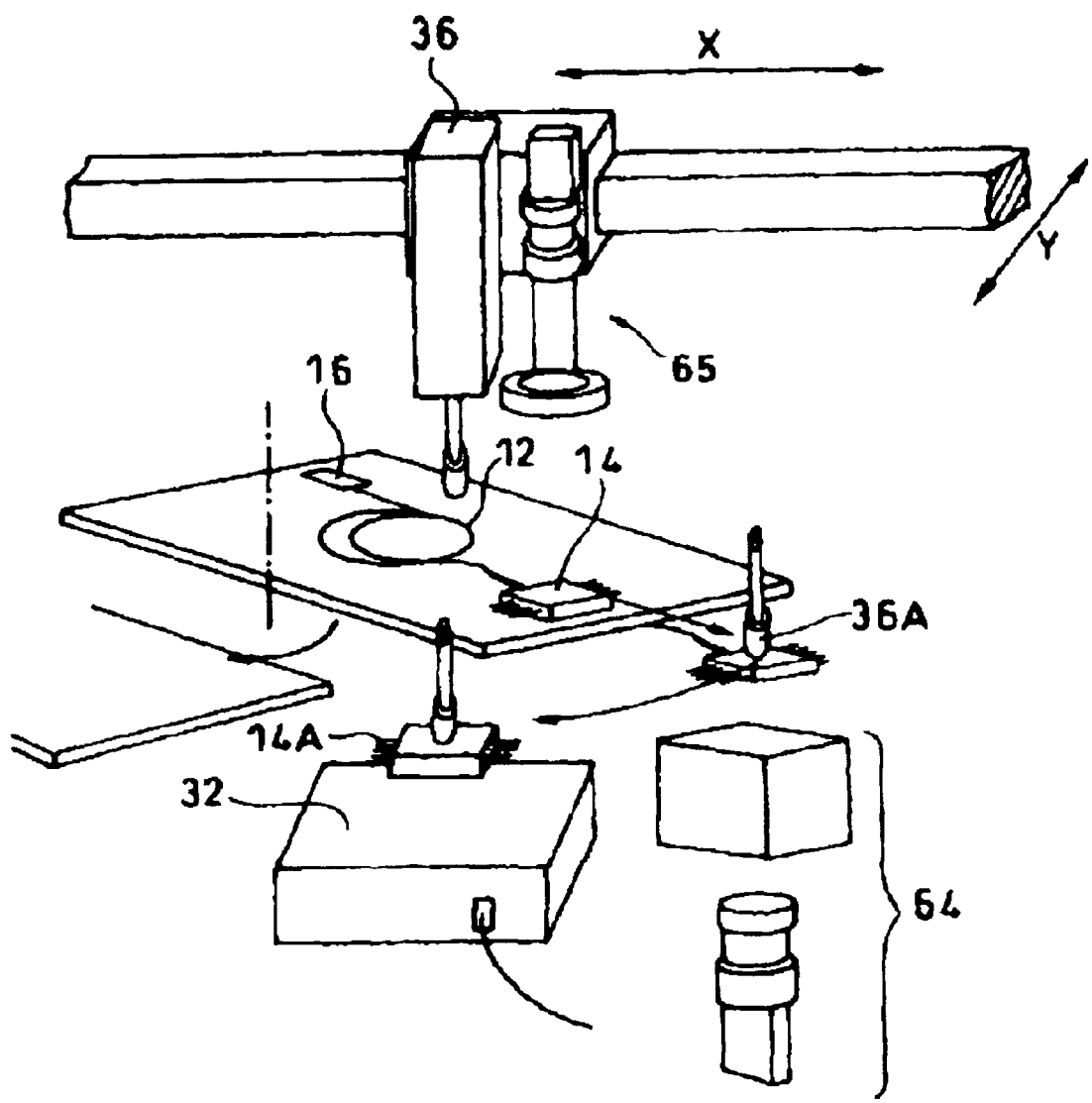
FIG. 12 is a perspective view illustrating the correcting operation based on image recognition in the apparatus.
Figure 13:
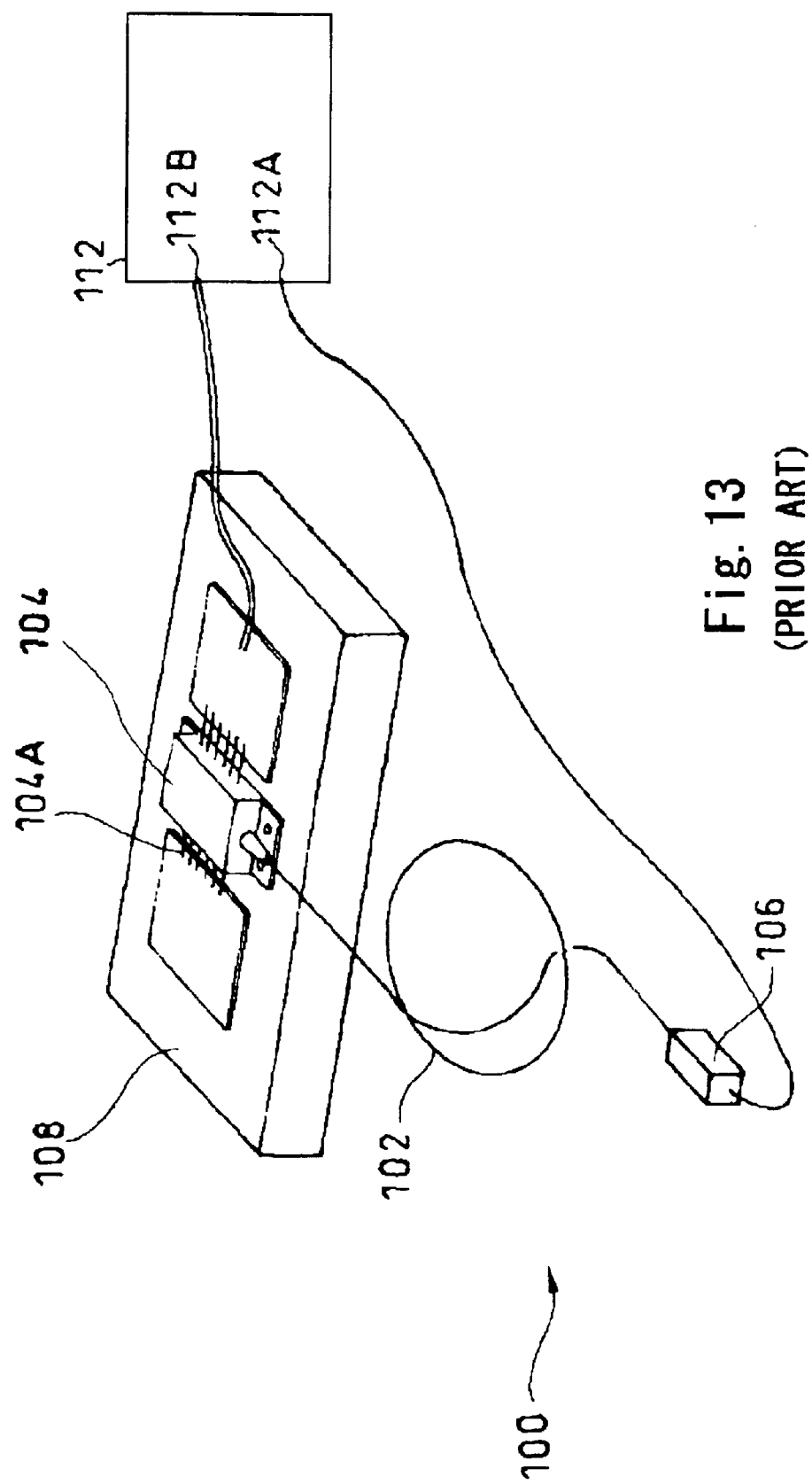
FIG. 13 is a perspective view illustrating a conventional testing method of a semiconductor device.
Figure 14:
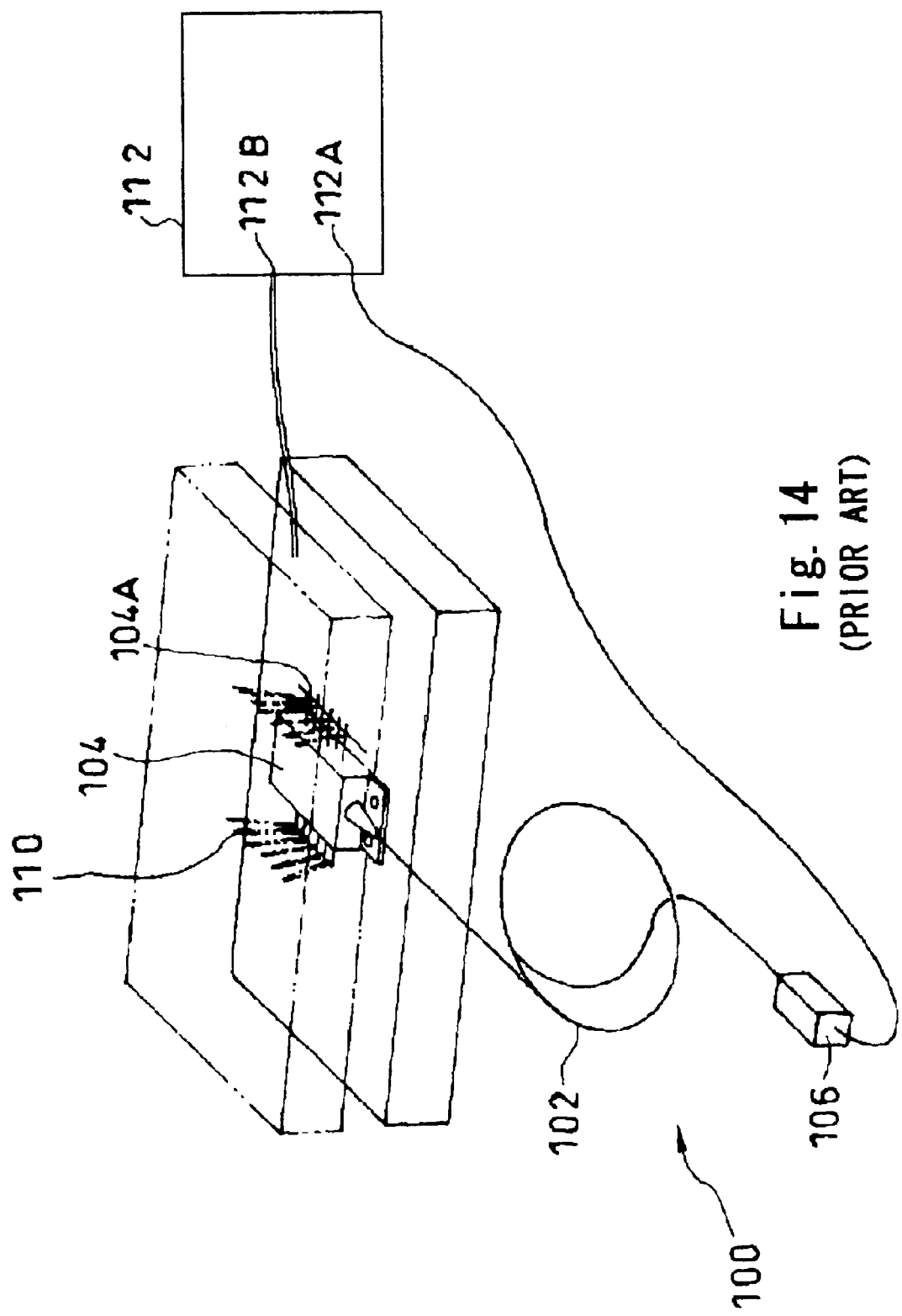
FIG. 14 is a perspective view illustrating a conventional testing method of a semiconductor device.

When transporting the body 14 from the imaging device 64 onto the probe 32 as shown in FIG. 12, the controller 66 controls the robot 36 so that the body 14 rotatably moves along the arced locus concentric with the center axis of the table 46. The actuator 48 is so controlled that the rotating direction and rotating speed of this rotational movement can conform to those of the table 46.

With this conformity, the device body 14 is transported from the imaging device 64 onto the probe 32, maintaining a constant relative position to the cable 12.

That is, since the form of the cable 12 connected with the body 14 is kept constant, the retained posture of the body 14, after imaging, is not changed by the reaction of the cable deformation.

Meanwhile, the probe imaging device 65 takes an image and detects the set position of the probe 32.

The controller 66 calculates in the position error calculating section 66D a set position error between the probe set position detected by the imaging device 65 and the reference set position stored in the reference position storing section 66C, and controls the inspection robot 36 to transport the device body 14 onto the probe 32, correcting the set position error.

Thus, the controller 66 detects, with the use of two imaging devices 64 and 65, a retained posture error of the device body 14 and a set position error of the probe 32, respectively, and transports the body 14 onto the probe 32 precisely together with the correction of both errors.

With this state, by driving the actuators 44A and 44B to raise the conveyor 44, a next tray 22 to be inspected, as in the same manner described above, is transported to the front-end area 25, where front-end processes are applied to, and waits for the next inspection.

Subsequently, a blower (not shown) removes dust or the like sticking to the inspection connector 30 and the relay connector 22A, and then the actuator 30A is driven to automatically couple the connector 30 to the connector 22A.

Next, after the body 14 comes into contact with the probe 32, the pressing mechanism 58 presses the terminals 14A against the probe 32, by lowering the pad 58A on the terminals 14A.

At this time, after the pad 58A gets contact with the terminals 14A, pressing force can be adjusted to a proper value with the adjustment of the shortened amount of the compression spring 58C by proper control of further lowering of the base portion 58B.

From the foregoing, the device body 14 is precisely positioned on the probe 32 with proper pressing force applied to.

In this state, the tester 34 supplies to the inspection connector 30 input signals, which are transmitted to the device body 14 to be converted through the relay connector 22A, the connector 16 and the cable 12, and output signals are generated on the terminals 14A.

The tester 34 receives these output signals through the probe 32, and tests various properties of the semiconductor device 18.

If an abnormal test result is found, the tester 34 tests the device 18 again in such procedure that the pad 58A is once raised to be apart from the terminals 14A, and lowered again to press the terminals 14A.

When the device 18 is correctly tested, or the re-test is completed, the inspection robot 36 restores the body 14 into the inspection tray 22. The cable 12 is restored again on the cable holder 22C in the original curved shape, being guided by the slope of the holder 22C.

Thereafter, the inspection connector 30 is detached from the relay connector 22A by driving the actuator 30A, then the actuators 44A and 44B are driven to lower the conveyor 44. Further, by driving the actuator 48 to rotate the table 46, the tray 22 on the inspection area 26 is rotatably transported to the front-end area 25, together with the transportation of the tray 22 waiting for the next inspection from the front-end area 25 to the inspection area 26.

The device 18 held in the tray 22, which is newly transported to the inspection area 26, is automatically tested in the similar procedure described above.

The tray 22, which has been rotatably transported to the front-end area 25 after the inspection, is returned to the tray storage 24 in the following procedure.

First, the clamp top end 54A is moved apart from the tray 22 to release the tray 22 by upward drive of the actuator 56, the conveyor 44 is raised by the drive of the actuators 44A and 44B, and the tray 22 is transported to near the storage 24.

Next, in order to unload the tested tray 22 between two trays to be adjacent to at the upper and lower sides, the actuator 24B is driven to move up or down the support base 24A so as to position the flanges 22F of the two trays to upper side and lower side of the upper support 38A, respectively.

Further, the upper support 38A is projected out toward the trays with downward movement of the base 24A, which causes the upper side tray 22 of the two to get contact with the upper support 38A and be supported on it.

The lower side tray 22 further goes down until it positions lower than the lower side support 38B, then the support 38B is projected out toward the trays. That is, the support 38B is projected out toward the vacant gap 24E.

Then, the actuators 42A and 42B of the unloader 42 project out toward the tray storage 24. This projection unloads the tested tray 22 on the conveyor 44 into the vacant selecting mechanism 38 with the tray 22 sliding on the support 38B.

Subsequently, the actuator 24B is driven to lift the trays in chain reaction with the base 24A. When the trays 22 are separated sequentially from the supports 38B and 38A, these supports 38B and 38A are retracted. Thus, the unloading of the tested tray 22 into the tray storage 24 is completed.

Following the above described procedure with the back-and-forth movement of the tray 22 between the storage 24 and the inspection area 26, inspection of the device 18 is sequentially executed.

When a series of test is completed, the operator releases the trays 22 from the upper guide 24C of the storage 24, and removes the piles of trays.

Test result is presented on the display 72 for each tray 22 corresponding to the piled order.

In a similar way, the inspection of the semiconductor devices 18 is repeated by storing piles of trays 22 in the tray storage 24.

Thus, the operator performs rather simple work only, that is, setting the device 18 on the tray 22 and piling the trays into the tray storage 24, and inspection procedure after these handling is executed automatically. Therefore, the automatic semiconductor device testing machine 10 can realize the test in high precision with high working efficiency.

Especially, since the device 18 is transported, being held in the tray 22 during automatic test, the device 18, though having a cable 12, is easy to transport and hard to be damaged.

The tray 22 holds the device 18 so that the cable 12 lies along the connecting direction at near device body 14 and can be taken out, being guided in the connecting direction when the body 14 is removed from or restored to the tray. Therefore, the removing or restoring of the body 14 does not damage the connecting point between the body 14 and the cable 12.

That is, the apparatus 10 has high reliability.

The inside of the tray 22 is shielded from outside when the trays are piled, which prevents the device 18 from sticking of foreign substance like dust. Additionally, dust elimination from the body 14 in front-end process and blowing of the relay connector 22A are employed. Therefore, the test is affected by foreign substance to a minimum.

Further, the imaging device 64 detects the retained posture of the body 14, and the controller 66 transports the body 14 to the probe 32 with the retained posture corrected. Therefore, the terminals 14A gets contact with the probe 32 without an error that may occur if the inspection is manually executed.

The pressing mechanism 58 presses the terminals 14A against the probe 32 with proper force, thereby achieving high-precision inspection with high reliability.

The table 46 holds two trays 22 on it, and front-end process is applied to one of two trays during the inspection of the other, thereby enhancing test efficiency.

In the embodiment, the body 14 retained by the inspection robot 36 is detected its posture by imaging device 64, and transported onto the probe 32 with the retained posture corrected, but the invention is not limited to this embodiment. If precise transportation is not required due to the kind of a semiconductor device or a probe, the device body may be directly transported from the tray to the probe without use of an imaging device.

The terminals 14A in the embodiment is pressed against the probe 32 by the pressing mechanism 58. However, if the pressing force is not critical due to the kind of a semiconductor device or a probe, device body terminals may be brought into contact with a probe only by the transportation by an inspection robot without use of a pressing mechanism.

If a semiconductor device is possible to test without contact between device terminals and a probe due to the kind of a semiconductor device or a probe, the device can be tested with transportation to a position close to the probe by an inspection robot.

The front-end robot 62 in the embodiment transports the device body 14 to the front-end system 60, but the inspection robot 36 may transport the device body 14 to the front-end system 60.

Thus, by using a robot as an front-end one and an inspection one, cost of the apparatus can be reduced. However, if the testing efficiency is regarded very important, two robots may be employed as in the embodiment for simultaneous operations of both inspection and front-end process with proper applications of the two robots.

In the embodiment, the trays 22 are removably held on the rotation table 46, and rotatably transported between the front-end area 25 and the inspection area 26. However, the tray 22 can be linearly transported, for example by a belt conveyor, from the front-end area 25 to the inspection area 26.

In this case, the front-end system 60, the imaging device 64, and the probe 32 may be arranged in this order linearly and in parallel with the belt conveyor.

In the front-end system 60 of the embodiment, heat-retaining process, dust-eliminating process and electrostatic discharge process are applied, but the invention is not limited to this embodiment. One or two processes only out of above processes can be applied in a front-end system according to the kind of a semiconductor device or a probe.

Further, if dust, static electricity, and temperature are not critical for testing a semiconductor device according to the kind of a device or a probe, test of the device can be executed without a front-end system. In this case, the test can be executed by removably setting the tray 22, for example, on a fixed inspection table instead of a transport mechanism like the rotation table 46.

The tester 34 in the embodiment applies input signals to the inspection connector 30 and receives output signals from the probe 32, but on the contrary, the tester 34 may applies input signals to the probe 32 and receives output signals from the inspection connector 30.

The transport mechanism 28 in the embodiment transports the tray 22 to the rotation table 46 through the belt conveyor 44, but a transport mechanism may consist of a rotation table only without a belt conveyor, if a tray storage can be installed neighboring the rotation table.

To the contrary, a transport mechanism can consist of a belt conveyor only without a rotation table, by transporting a tray back and forth linearly.

Further, the transport mechanism 28 in the embodiment transports the tray 22 in both directions so as to return the tested tray 22 to the tray storage 24, but as another arrangement, a transport mechanism may transport the tray 22 from the storage 24 to the inspection area 26 in one direction, and send out a tested tray from an inspection area to another transport mechanism equipped at an opposite side of the tray storage.

As explained above, the invention achieves such superior effects that a semiconductor device connected with a cable can be automatically tested in high precision with high efficiency.

What is claimed is:

1. An automatic semiconductor device testing apparatus comprising:

a tray for holding a semiconductor device that has a cable, a device body connected with one end of the cable, and a connector connected with the other end of the cable, so that the connector can couple to a mating connector directly or indirectly with the device held in the tray, the cable being held in the tray;

an inspection connector for automatically coupling to the connector held in the tray;

a probe for applying or receiving signals to or from the device body, being in contact with or close to terminals of the device body;

an inspection robot for picking up the device body held in the tray and transporting it to the probe to get contact with or close to;

a controller to control the inspection robot; and a tester for testing the device by applying input signals to one side of the inspection connector or the probe and receiving output signals from the other side.

2. The apparatus as claimed in claim 1, wherein the tray holds the cable near the device body so that the cable is set along a connecting direction of the device body, and that the cable can be guided in the connecting direction when the device body is removed from or restored into the tray.

3. The apparatus as claimed in claim 1, further comprising a pressing mechanism for pressing the terminals of the device body on the probe in the state that the device body is in contact with or close to the probe.

4. The apparatus as claimed in claim 1, further comprising a device body imaging device for detecting the posture of the device body retained on the inspection robot, wherein said controller includes a reference posture storing section for storing a reference retained posture, and a posture error calculating section for calculating an error between the reference retained posture and the retained posture detected by the device body imaging device, and controls the inspection robot to transport the device body onto the probe together with correction of the calculated error.

5. The apparatus as claimed in claim 2, further comprising a tray transfer device for holding and transferring the tray, wherein said controller is adapted to control both of the tray transfer device and the inspection robot in synchronism with each other so that the device body can be transported from the detected position of the retained posture by the device body imaging device to the probe with the relative position between the device body and the cable maintained.

6. The apparatus as claimed in claim 5, wherein said tray transfer device is a rotation table to hold and rotatably transfer the tray, and the device body imaging device and the probe are arranged along an arced locus concentric with the table, and wherein the controller controls the inspection robot so that the device body rotatably moves along the arced locus from the device body imaging device to the probe.

7. The apparatus as claimed in claim 6, wherein the rotation table is capable of holding a plurality of trays.

8. The apparatus as claimed in claim 1, further comprising a probe imaging device for detecting a probe set position, wherein said controller has a reference position storing section for storing a reference set position of the probe, and a position error calculating section for calculating an error between the reference set position and the probe set position detected by the probe imaging device, and controls the inspection robot so as to transport the device body onto the probe with the set position error corrected.

9. The apparatus as claimed in claim 8, wherein the probe imaging device can detect the position of the device terminals brought into contact with or close to the probe, and wherein the controller has a displacement calculating section for calculating the displacement between the probe and the terminals based on the probe set position and the position of the terminals, and an allowable value storing section for storing a given allowable displacement value, and controls the inspection robot so that the device body can get into contact with or close to the probe with the displacement corrected if the calculated displacement is over the allowable value.

10. The apparatus as claimed in claim 1, further comprising:
 a front-end system for executing a heat-retaining process to keep the device body in a given temperature, a dust removing process to remove foreign substance from the device body, and an electrostatic discharge process to discharge static electricity from the device body; and
 a front-end robot for picking up the device body held on the tray, and transferring it to the front-end system.

11. An automatic semiconductor device testing apparatus comprising:
 a tray for holding a semiconductor device that has a cable, a device body connected with one end of the cable, and a connector connected with the other end of the cable, so that the connector can couple to a mating connector directly or indirectly with the device held in the tray, the cable being held in the tray;
 a tray storage capable of storing a plurality of piled trays, having a tray selecting mechanism for supporting a selected tray separated from adjacent trays, and an ejector for ejecting the tray supported on the selecting mechanism;
 a transport mechanism for transporting the tray ejected from the tray storage sequentially to an inspection area with the device held in the tray;
 an inspection connector for automatically coupling to the connector held in the tray at the inspection area;
 a probe disposed at the inspection area for applying or receiving signals to or from the device body, being in contact with or close to terminals of the device body; and
 a tester for testing the device by applying input signals to one side of the inspection connector or the probe and receiving output signals from the other side.

12. The apparatus as claimed in claim 11, wherein the transport mechanism is adapted to transfer back a tray, which holds the inspected device, to the tray storage, and wherein an unloader unloads the returned tray into an open space of the tray selecting mechanism.

13. A method for automatically testing a semiconductor device, the device having a cable, a device body connected with one end of the cable, and a connector connected with the other end of the cable, the method comprising the steps of:
 holding the device and cable in a tray so that the connector can couple to a mating connector directly or indirectly;
 storing a plurality of the trays in a tray storage;
 selecting a certain tray from the tray storage;
 transporting the selected tray sequentially to an inspection area with the device held in the tray;
 coupling automatically an inspection connector to the connector held in the tray at the inspection area;
 bringing the device body into contact with or close to a probe;
 testing the device automatically and continuously by applying input signals to one side of the inspection connector or the probe and receiving output signals from the other side; and
 returning the tray after the test into the tray storage on its expected step position.

* * * * *